United States Patent
Shen (10) Patent No.: US 11,409,340 B2
(45) Date of Patent: Aug. 9, 2022

(54) THERMAL MITIGATION IN A PORTABLE COMPUTING DEVICE BY ACTIVE HEAT TRANSFER TO A DOCKING DEVICE

(71) Applicant: QUALCOMM INCORPORATED, San Diego, CA (US)

(72) Inventor: Jian Shen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/909,933

(22) Filed: Jun. 23, 2020

(65) Prior Publication Data

US 2021/0397230 A1     Dec. 23, 2021

(51) Int. Cl.
| | | |
|---|---|---|
| G06F 1/20 | (2006.01) | |
| G06F 1/16 | (2006.01) | |
| H05K 7/20 | (2006.01) | |

(52) U.S. Cl.
CPC ............ *G06F 1/203* (2013.01); *G06F 1/1632* (2013.01); *G06F 1/206* (2013.01); *H05K 7/2039* (2013.01)

(58) Field of Classification Search
CPC .......... G06F 1/203; G06F 1/1632; G06F 1/20; G06F 2200/201; G06F 1/206; H05K 7/20; H05K 7/20154; H05K 7/2039; H05K 7/20445; H01R 12/7076; H01R 24/60; H01R 33/945
See application file for complete search history.

(56) References Cited

U.S. PATENT DOCUMENTS

| | | | | |
|---|---|---|---|---|
| 5,704,212 A | * | 1/1998 | Erler ..................... | F25B 21/04 361/679.41 |
| 6,047,766 A | * | 4/2000 | Van Brocklin ......... | G06F 1/206 361/679.48 |
| 6,084,769 A | * | 7/2000 | Moore .................... | G06F 1/203 165/104.33 |
| 6,118,654 A | * | 9/2000 | Bhatia .................... | G06F 1/203 165/104.14 |
| 6,191,943 B1 | * | 2/2001 | Tracy ..................... | G06F 1/1632 361/679.46 |
| 6,276,448 B1 | * | 8/2001 | Maruno ................ | G06F 1/1632 165/104.33 |
| 6,415,612 B1 | * | 7/2002 | Pokharna ................ | F25B 21/02 165/80.2 |
| 6,445,580 B1 | * | 9/2002 | Cohen ..................... | G06F 1/20 257/E23.082 |
| 6,453,378 B1 | * | 9/2002 | Olson .................... | G06F 1/1632 361/679.41 |
| 7,342,783 B2 | * | 3/2008 | Park ...................... | G06F 1/1632 165/80.3 |

(Continued)

OTHER PUBLICATIONS

International Search Report and Written Opinion—PCT/US2021/ 037352—ISA/EPO—dated Sep. 24, 2021.

*Primary Examiner* — Michael A Matey
(74) *Attorney, Agent, or Firm* — Smith Tempel Blaha LLC/Qualcomm (57) ABSTRACT

A PCD may include an active heat transfer system configured to transfer heat from the PCD to a docking device. The active heat transfer system may include a thermoelectric cooler, a heat pipe, or other heat transfer elements. The active heat transfer system may, based on temperature measurements, be activated when the PCD is coupled to the docking device.

28 Claims, 7 Drawing Sheets

(56) References Cited

U.S. PATENT DOCUMENTS

| | | | |
|---|---|---|---|
| 7,403,384 B2* | 7/2008 | Pflueger | H05K 7/20545 165/104.21 |
| 7,872,864 B2* | 1/2011 | Mongia | G06F 1/203 361/695 |
| 9,905,359 B2* | 2/2018 | Sultenfuss | H01F 38/14 |
| 10,401,925 B2* | 9/2019 | Uchino | G06F 1/1632 |
| 2002/0105783 A1* | 8/2002 | Kitahara | G06F 1/1632 361/695 |
| 2002/0186531 A1* | 12/2002 | Pokharna | G06F 1/1632 361/679.09 |
| 2003/0110779 A1* | 6/2003 | Otey | F25B 25/00 62/3.2 |
| 2005/0161197 A1* | 7/2005 | Rapaich | G06F 1/1632 165/80.4 |
| 2006/0126289 A1* | 6/2006 | Takenoshita | G06F 1/203 361/679.47 |
| 2006/0232929 A1* | 10/2006 | Huang | G06F 1/1632 361/688 |
| 2007/0091560 A1* | 4/2007 | Parker | G06F 1/203 361/679.48 |
| 2008/0052428 A1 | 2/2008 | Liang et al. | |
| 2009/0119435 A1* | 5/2009 | Mok | G06F 1/203 710/304 |
| 2010/0008036 A1* | 1/2010 | Risher-Kelly | G06F 1/203 361/679.47 |
| 2012/0236501 A1* | 9/2012 | Nagasawa | G06F 1/206 165/185 |
| 2014/0185241 A1* | 7/2014 | MacDonald | H05K 7/2029 361/704 |
| 2016/0231778 A1* | 8/2016 | Kaneko | G06F 1/1632 |
| 2020/0089292 A1 | 3/2020 | North et al. | |

* cited by examiner

THERMAL MITIGATION IN A PORTABLE COMPUTING DEVICE BY ACTIVE HEAT TRANSFER TO A DOCKING DEVICE

DESCRIPTION OF THE RELATED ART

Portable computing devices ("PCD"s) are becoming necessities for people on personal and professional levels. These devices may include cellular telephones (e.g., smartphones), tablet computers, palmtop computers, portable digital assistants ("PDA"s), portable game consoles, and other portable electronic devices. PCDs commonly contain integrated circuits or systems-on-a-chip ("SoC"s) that include numerous components designed to work together to deliver functionality to a user. For example, an SoC may contain any number of processing engines, such as central processing units ("CPU"s) with multiple cores, graphical processing units ("GPU"s), etc. An SoC may be coupled to other components within a PCD, such as system memory, wireless communication transceivers (also referred to as modems), power management systems, a charger integrated circuit (IC), touch-screen displays, cameras, microphones, speakers, etc.

In operation, the electronic circuitry within a PCD generates heat or thermal energy, which at excessive levels may be detrimental to the internal circuitry or, when conducted through the PCD case, could scorch a user's hand. The amount of thermal energy that is generated may vary depending upon the operating conditions. For example, processors may generate substantial thermal energy when operating at high workload levels or data rates. Also, power supply circuitry in the PCD may generate substantial thermal energy when the PCD is coupled to a battery charger.

One or more thermal sensors positioned within the PCD may be monitored to determine if the PCD or a portion thereof has reached a threshold or critical temperature. When a reading of the thermal sensor indicates that the PCD or monitored portion thereof has reached such a threshold temperature, an action intended to reduce thermal energy production or otherwise mitigate adverse effects of the thermal energy may be initiated. For example, the power (e.g., voltage and clock frequency) applied to a processor may be reduced. Using temperature measurements as feedback in a control loop to adjust how a PCD operates is sometimes referred to as "thermal management" or "thermal mitigation." Adjusting voltage and clock frequency in this manner is sometimes referred to as dynamic clock and voltage scaling ("DCVS"). Such thermal mitigation techniques have traditionally been capable of restraining heat generation to a level below which excess heat can be safely dissipated by passive conduction through the PCD case into the ambient air.

In contrast with the type of thermal mitigation in a PCD described above, thermal mitigation in a desktop or laptop computer or similarly larger, less portable device may include actively removing heat from the device through the device housing or case, because there is space and adequate power source in the housing to accommodate active heat transfer features. For example, a desktop or laptop computer may include a fan that circulates air through ventilation openings in the housing. A desktop or laptop computer may include heat sinks, thermoelectric cooling devices, heat pipes, etc., because the heat can be channeled through the housing and dissipated into the external environment. In contrast, the sealed compact case of a PCD, the limited battery capacity, and the need to maintain the case at a temperature that is comfortable for a user to hold present particular challenges to thermal mitigation.

SUMMARY OF THE DISCLOSURE

Systems, methods, and other embodiments are disclosed for thermal mitigation in a PCD by active heat transfer to a docking device, such as a docking station, charging station, or other electronic device to which a PCD may be connected.

An exemplary system for thermal mitigation in a PCD may include a PCD case, a thermal coupler having a portion exposed externally to the PCD case, an active heat transfer system within the PCD case, a thermal sensor within the PCD case, and a control system within the PCD case. The active heat transfer system may have a first portion thermally coupled to a heat source component within the PCD case and a second portion thermally coupled to the thermal coupler. The active heat transfer system may be configured to transfer thermal energy from the first portion to the second portion when activated, and is activated based on a temperature measurement of the heat source component and when the PCD is coupled to a docking device.

Another exemplary system for thermal mitigation in a PCD may include a PCD case, a thermal coupler having a portion exposed externally to the PCD case, a thermoelectric device thermally coupled to the thermal coupler, a heat pipe, a thermal sensor within the PCD case, and a control system within the PCD case. The heat pipe may have a first end thermally coupled to a heat source component within the PCD case and a second end thermally coupled to the thermoelectric device. The heat pipe may be configured to transfer thermal energy from the first end to the second end. The thermoelectric device may be configured to transfer thermal energy from the second end of the heat pipe to the thermal coupler when activated. The thermoelectric device may be activated based on a temperature measurement of the heat source component and when the PCD is coupled to a docking device.

An exemplary method for thermal mitigation in a PCD may include obtaining a plurality of temperature measurements associated with a heat source component of the PCD using a thermal sensor within a PCD case, determining whether the PCD is coupled to a docking device, and activating an active heat transfer system within the PCD case based on at least one of the plurality of temperature measurements when the PCD is coupled to the docking device. Activating the active heat transfer system may include transferring thermal energy from a first portion of the active heat transfer system thermally coupled to a heat source component within the PCD to a second portion of the active heat transfer system and to a portion of a thermal coupler exposed externally to the PCD case.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary" Any aspect described herein as "exemplary" is not necessarily to be construed as preferred or advantageous over other aspects.

While thermal mitigation techniques such as DCVS have traditionally been capable of restraining heat generation to a level below which excess heat can be safely dissipated by passive conduction through the PCD case, the development of increasingly powerful, feature-rich PCDs may challenge this paradigm. Indeed, dissipating excess heat by passive conduction through the PCD case or associated parts (e.g., a connector port) is inefficient, as the case, connector port, etc., of a conventional PCD are poor thermal conductors. Also, as PCDs become increasingly powerful, faster battery charging is becoming increasingly important. A drawback of fast-charging technology is that a charging PCD may produce more heat than can be safely dissipated by passive conduction through the PCD case into the ambient air. Fast-charging technology may deliver power to a PCD on the order of tens of watts. Conventional fast-charging technology has addressed the potential problem of a PCD overheating from such high power by throttling the charging rate. Throttling the charging rate by fast-charging technology, like throttling PCD performance by traditional PCD thermal management technology, potentially adversely impacts the user experience. The present disclosure presents a novel solution that addresses these various but related issues.

Figure 1:
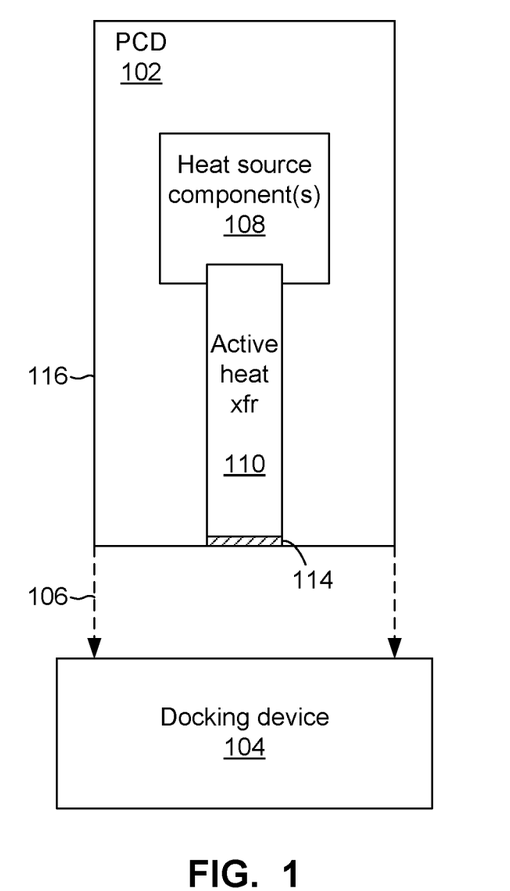
FIG. 1 is a functional block diagram illustrating a PCD having an active heat transfer system being docked or coupled to a docking device, in accordance with exemplary embodiments.
Figure 2:
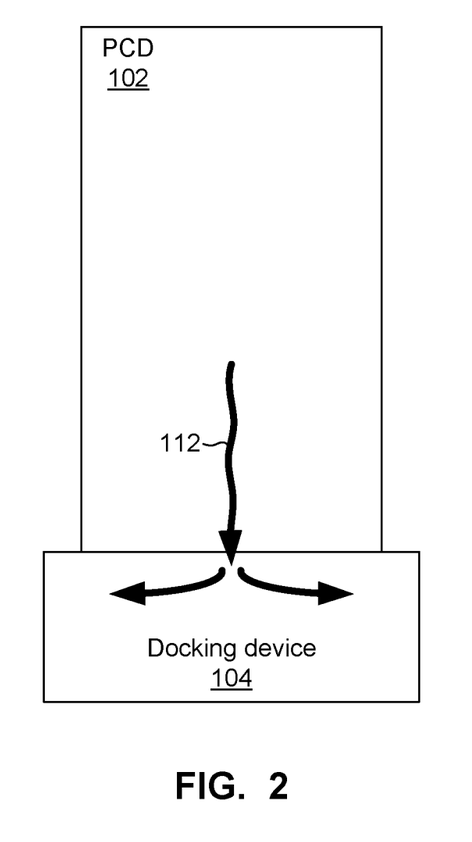
FIG. 2 is similar to FIG. 1, illustrating heat transfer from the PCD to the docking device when the PCD is coupled to the docking device.

As illustrated in FIGS. 1-2, in an illustrative or exemplary embodiment, a PCD 102 is coupleable or dockable to a docking device 104, as conceptually indicated by the broken-line arrows 106. The PCD 102 may be, for example, a cellular telephone (e.g., smartphone), tablet computer, palmtop computer, portable digital assistant ("PDA"), portable game console, or any other portable electronic device featuring data processing. A user (not shown) may couple the PCD 102 to the docking device 104 and de-couple the PCD 102 from the docking device 104 in a conventional manner, as described below. As used in this disclosure, the term "docking device" includes any user-coupleable electronic device that provides an additional feature or service to the PCD 102. Examples of the docking device 104 include docking stations that provide the PCD 102 with additional processing, storage, user interface, display, communication, sanitation (e.g., ultraviolet irradiation box), or other features. Examples of the docking device 104 also include charging devices that charge the battery (not shown in FIG. 1) of the PCD 102. As used in this disclosure, to "dock" the PCD 102 to the docking device 104 broadly includes any manner of coupling the PCD 102 to the docking device 104.

The PCD 102 may include one or more heat source components 108, such as processors (e.g., an application processor or baseband processor), a radio frequency (RF) integrated circuit (IC), battery charging circuitry, power control circuitry, battery, etc., which produce heat as a by-product of their operation. Once a user has coupled or docked the PCD 102 to the docking device 104, an active heat transfer system 110 in the PCD 102 may be activated, if beneficial to do so. As described below in further detail, activation of the active heat transfer system 110 may be based on temperature measurements. Whether it is beneficial to activate the active heat transfer system 110 may be determined in various ways. For example, it may be beneficial to activate the active heat transfer system 110 when at least one temperature measurement exceeds a threshold. Alternatively, it may be beneficial to activate the active heat transfer system 110 when at least one temperature measurement exceeds a previous temperature measurement by a threshold amount (e.g., within a certain time interval), indicating that the temperature is increasing faster than a threshold rate of increase. When the temperature rises rapidly, conventional thermal mitigation techniques and passive PCD heat dissipation by conduction through the PCD case may be insufficient or slower to respond. Still other circumstances or conditions under which it may be beneficial to activate the active heat transfer system 110 will occur readily to one of ordinary skill in the art in view of these teachings. When activated, the active heat transfer system 110 may transfer heat 112 (FIG. 2) produced by the one or more components 108 from the PCD 102 to the docking device 104.

As described below in further detail, the heat may be transferred from the PCD 102 to the docking device 104 through a thermal coupler 114 (FIG. 1) of the PCD 102. The thermal coupler 114 extends between the interior and exterior of the PCD case 116. The PCD case 116 may be substantially sealed to protect internal components against intrusion of moisture, contaminants, etc. Accordingly, the PCD case 116 may be devoid of openings such as ventilation holes or grilles. A portion of the thermal coupler 114 that is exposed externally to the PCD case 116 is thermally coupleable with a portion of the docking device 104. Examples of the thermal coupler 114 include structures that extend through the PCD case 116 and have a higher thermal conductivity than the PCD case 116. For example, the thermal coupler 114 may be made of metal, alloy, boron arsenide, marble, carbon, or other high thermal conductivity material, and the case 116 may be made of plastic, glass, or other material having a lower thermal conductivity than the thermal coupler 114. Another example of the thermal coupler 114 may be a region of the PCD case 116 that has a higher thermal conductivity than other portions of the PCD case 116. Constraining the excess heat largely to a thermal coupler 114 having an area that is small relative to the area of the surface of the PCD case 116 and that is unobtrusively located on the PCD case 116 may be advantageous because a user is unlikely to touch the thermal coupler 114 or mating portion of the docking device 104 while the PCD 102 is docked to the docking device 104.

Figure 3:
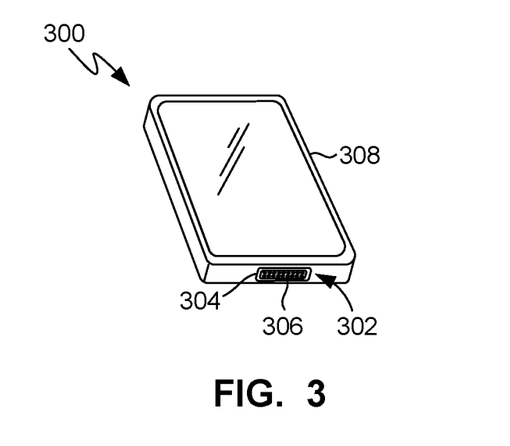
FIG. 3 is a perspective view of a PCD having a docking connector with a thermally conductive portion, in accordance with exemplary embodiments.

As illustrated in FIG. 3, in an exemplary embodiment a PCD 300 may include an electrical connector 302 having a PCD connector body portion 304 around a PCD signal contact array 306. The PCD 300 may be an example of the above-described PCD 102 (FIGS. 1-2). The connector body portion 304 may be an example of the above-described thermal coupler 114 (FIG. 1). Examples of the connector body portion 304 may include a flange, skirt, escutcheon, housing, shield, mechanically or magnetically mateable plug or socket portion, etc., associated with the electrical connector 302. Note that in the embodiment illustrated in FIG. 3, both the connector body portion 304 and signal contact array 306 are exposed externally to the PCD case 308.

Figure 4:
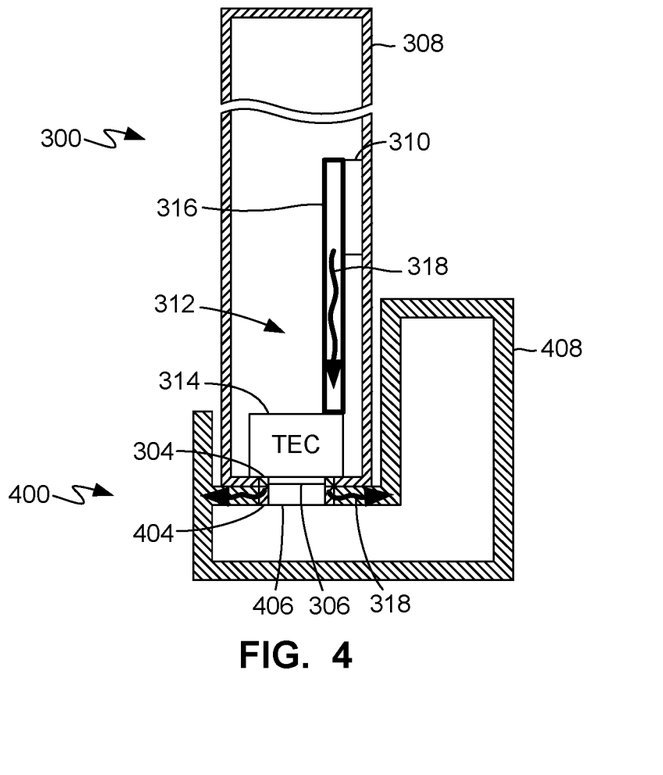
FIG. 4 is a diagrammatic sectional view illustrating the PCD of FIG. 3 docked or coupled to a charger station through the docking connector, in accordance with exemplary embodiments.

As illustrated in FIG. 4, the PCD connector body portion 304 and PCD signal contact array 306 are configured to mate or couple with a corresponding docking device connector body portion 404 and docking device signal contact array 406, respectively, of a docking device 400. In the embodiment illustrated in FIG. 4, the docking device 400 may be a charging station. (Charging circuitry and other internal details of the docking device 400 are not shown for purposes of clarity. Similarly, internal structure or circuitry of the PCD 300 not related to the thermal mitigation described herein is not shown in FIG. 4.) A user (not shown) may couple the PCD 300 to the docking device 400 in a conventional manner, such as by inserting the PCD 300 into a receptacle region of the docking device 400 until the PCD 300 is seated or docked. When the PCD 300 is docked with the docking device 400, the PCD signal contact array 306 and docking device signal contact array 406 may electrically mate or couple in a conventional manner. Also when the PCD 300 is docked with the docking device 400, the PCD connector body portion 304 and docking device connector body portion 404 may thermally couple by contacting each other, thereby providing a thermally conductive path from the PCD connector body portion 304 to the docking device connector body portion 404.

The PCD 300 may include one or more heat source components 310 that produce heat as a by-product of their operation. An example of a heat source component 310 is a device that controls charging of a PCD battery (not shown) when the PCD 300 is docked to the docking device 400. Once a user has docked the PCD 300 to the docking device 400, an active heat transfer system 312 in the PCD 300 may be activated. As described below in further detail, activation of the active heat transfer system 312 may be based on temperature measurements.

The active heat transfer system 312 may include a Peltier device or thermoelectric cooler ("TEC") 314, and activation of the active heat transfer system 312 may include activation of the TEC 314. The docking device 400 may supply the power that the TEC 314 consumes in operation, i.e., when activated, through an electrical connection between one or more contacts (not separately shown) in the PCD signal contact array 306 and one or more contacts in the docking device conductor array 406.

The active heat transfer system 312 may include a heat pipe 316. The heat pipe 316 may have a conventional structure and be based on passive or active heat pipe technology. As well understood by one of ordinary skill in the art, heat pipe technology commonly utilizes phase changes in a fluid inside evaporator and condenser portions to facilitate the heat transport. Although heat pipe technology is more commonly employed in desktop, laptop and other computing devices larger than the PCD 300, scaling such heat pipe technology for inclusion in the PCD 300 is within the capability of one of ordinary skill in the art. In the illustrated embodiment, the heat pipe 316 may be passive. Nevertheless, in another example (not shown) of a PCD, in which the heat pipe utilizes active heat pipe technology, activation of the active heat transfer system may include activation of the heat pipe.

When activated, the active heat transfer system 312 may transfer or move heat 318 from the one or more components 310 of the PCD 300 to the docking device 400. For example, a first end of the heat pipe 316 may be in contact with one of the components 310 or otherwise thermally coupled with the component 310. As used in this disclosure, the term "in contact with" or "directly connected to" refers to the absence of an intervening electronic or mechanical component between the referenced elements but does not exclude the use of a thermal compound between them. A second end of the heat pipe 316 may be in contact with the TEC 314 or otherwise thermally coupled with the TEC 314. The TEC 314, in turn, may be in contact with or otherwise thermally coupled with the PCD connector body portion 304. The TEC 314 may promote active heat transfer from the heat pipe 316 to the PCD connector body portion 304. As the structure and operation of the TEC 314 are well understood by one of ordinary skill in the art, such details are not described herein. Contact between the PCD connector body portion 304 and the docking device connector body portion 404 provides a thermally conductive path for heat transfer from the PCD 300 to the docking device 400. The docking device connector body portion 404 may be in contact with the docking device housing 408, which may serve as a heat sink to dissipate heat conducted from the docking device connector body portion 404.

Although in the embodiment illustrated in FIGS. 3-4 contact between the PCD connector body portion 304 and the docking device connector body portion 404 provides the thermally conductive path for heat transfer from the PCD 300 to the docking device 400, in other embodiments mating signal contacts of the PCD and docking device may provide not only a conventional signal path hut also a thermally conductive path. For example one or more signal contacts similar to those in the PCD signal contact array 306 in the illustrated embodiment may be thermally coupled to (but electrically insulated from) a TEC, and one or more mating signal contacts similar to those in the docking device signal contact array 406 in the illustrated embodiment may be thermally coupled to (but electrically insulated from) the docking device housing.

Figure 5:
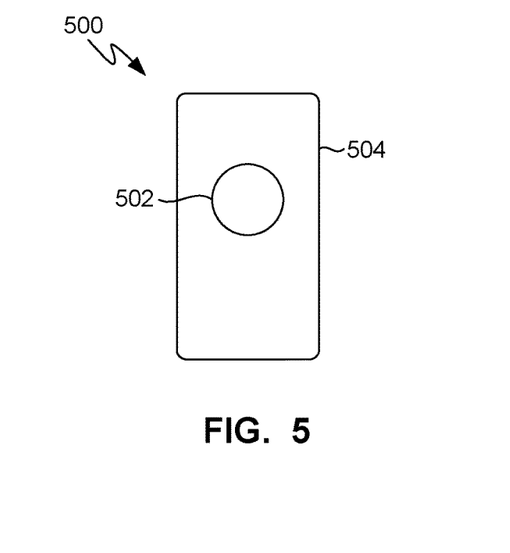
FIG. 5 is a plan view of the rear side of a PCD having a thermally conductive pad or region, in accordance with exemplary embodiments.

As illustrated in FIG. 5, in another exemplary embodiment a PCD 500 may include a thermally conductive (e.g., made of metal) region 502 on the rear face of the PCD case 504. The region 502 could be similar material to the rest of the rear face, albeit thinner or thermally coupled to the inside of PCB to a higher degree than the rest of the rear face. (The front face of the PCD 500, which may include, for example, a touch screen, is not shown for purposes of clarity.) The PCD 500 may be an example of the above-described PCD 102 (FIGS. 1-2). The region 502 may have another function in addition to the thermal conduction described herein, or the region 502 may serve an ergonomic, ornamental, or other purpose in addition to the heat conduction function described herein. The thermally conductive region 502, which thus may also be referred to for convenience as a PCD thermal pad 502, may be an example of the above-described thermal coupler 114 (FIG. 1).

Figure 6:
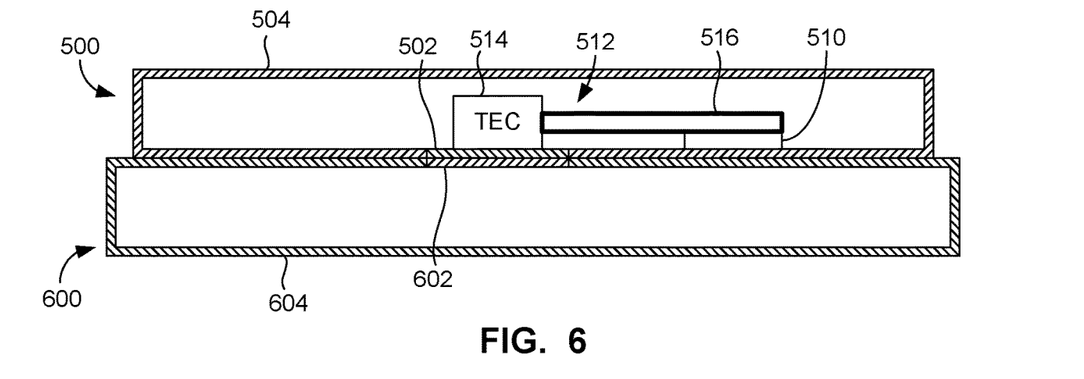
FIG. 6 is a diagrammatic sectional view illustrating the PCD of FIG. 5 resting on a wireless charging pad of a charger station, in accordance with exemplary embodiments.

As illustrated in FIG. 6, a user (not shown) may be couple or dock the PCD 500 to a docking device 600 by placing the PCD 500 on a surface of the docking device 600. Although in the illustrated embodiment the PCD 500 and docking device 600 are coupled or docked by placing the PCD 500 on a surface of the docking device 600, in other embodiments such a PCD and docking device may be coupled or docked by bringing the PCD 500 into proximity with the docking device 600 in some other manner. For example, in such other embodiment (not shown) a portion of the PCD may be inserted in a receptacle portion of the docking station, in a manner similar to that described above with regard to FIG. 4.

In the embodiment illustrated in FIG. 6, the docking device 600 may be a charging station or pad that wirelessly (e.g., by induction, etc.) charges a battery (not shown) of the PCD 500. (Charging circuitry and other internal structure of the docking device 600 are not shown for purposes of clarity. Similarly, internal structure or circuitry of the PCD 500 not related to the thermal mitigation described herein is not shown). When the rear surface of the PCD 500 rests on the upper surface of the docking device 600, the docking device 600 may wirelessly charge the PCD 500 in a conventional manner by inductive coupling between respective inductive coils (not shown) in the docking device 600 and PCD 500. Also when the PCD 500 is docked with the docking device 600, the PCD thermal pad 502 and docking device thermal pad 602 may thermally couple by contacting each other, thereby providing a thermally conductive path from the PCD thermal pad 502 to the docking device thermal pad 602.

The PCD 500 may include one or more heat source components 510 that produce heat as a by-product of their operation. An example of a heat source component 510 is a device that controls charging of a PCD battery (not shown) when the PCD 500 is docked to the docking device 600. Once a user has coupled or docked the PCD 500 to the docking device 600, an active heat transfer system 512 in the PCD 500 may be activated. As described below in further detail, activation of the active heat transfer system 512 may be based on temperature measurements.

The active heat transfer system 512 may include a TEC 514, and activation of the active heat transfer system 512 may include activation of the TEC 514. The docking device 600 may supply the power that the TEC 514 consumes in operation, i.e., when activated, through the wireless charging (inductive) coupling described above.

The active heat transfer system 512 may include a heat pipe 516. The heat pipe 516 may be similar to the heat pipe 316 described above with regard to FIG. 4. In the illustrated embodiment, the heat pipe 516 may be passive. Nevertheless, in another example (not shown) of a PCD, in which the heat pipe utilizes active heat pipe technology, activation of the active heat transfer system may include activation of the heat pipe.

When activated, the active heat transfer system 512 may transfer or move heat from the one or more components 510 of the PCD 500 to the docking device 600. For example, a first end of the heat pipe 516 may be in contact with one of the components 510 or otherwise thermally coupled with the component 510, and a second end of the heat pipe 516 may be in contact with the TEC 514 or otherwise thermally coupled with the TEC 514. The TEC 514, in turn, may be in contact with or otherwise thermally coupled with the PCD thermal pad 502. The TEC 514 may promote active heat transfer from the heat pipe 516 to the PCD thermal pad 502. Contact between the PCD thermal pad 502 and the docking device thermal pad 602 provides a thermally conductive path for heat transfer from the PCD 500 to the docking device 600. The docking device thermal pad 602 may be in contact with the docking device housing 604, which may serve as a heat sink to dissipate heat conducted from the docking device thermal pad 602.

Figure 7:
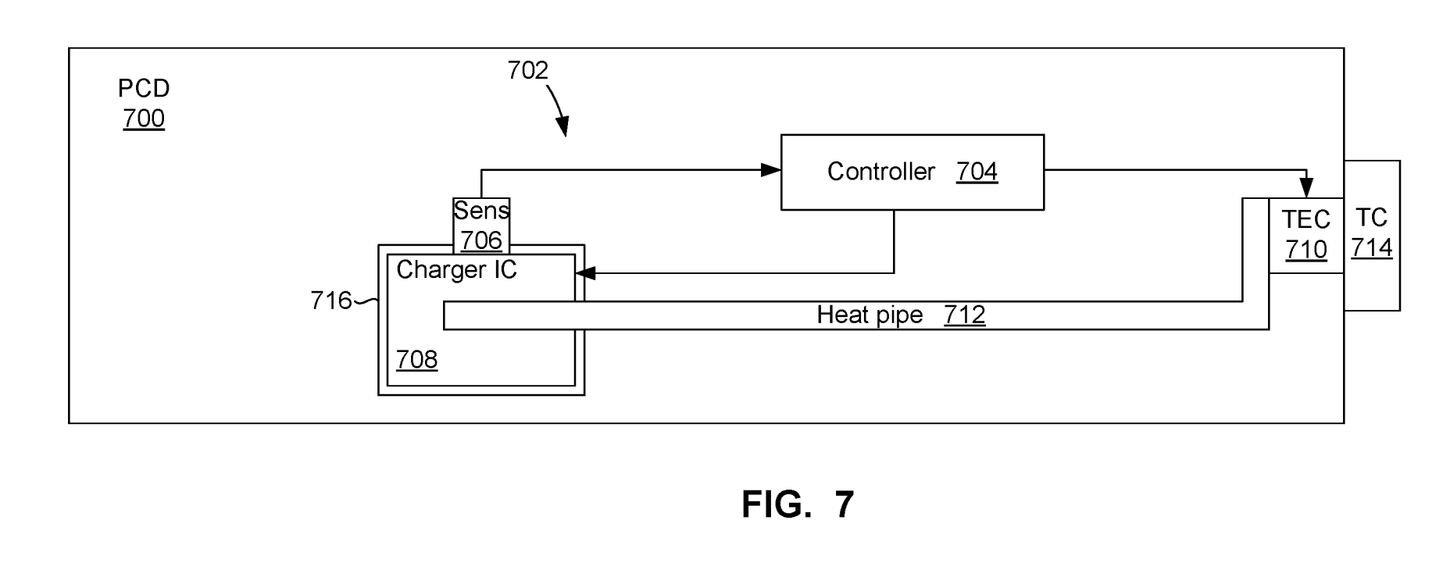
FIG. 7 is a functional block diagram of an exemplary PCD, showing a thermoelectric cooler and heat pipe of the active heat transfer system, in accordance with exemplary embodiments.

As illustrated in FIG. 7, in an exemplary embodiment a PCD 700 may include, among other elements, a control system 702 comprising a controller 704 and a thermal sensor 706. Other elements of the PCD 700 may be similar to those described above with regard to other embodiments, including: a charger IC 708, which may be an example of any of the above-described heat source components 106 (FIG. 1), 310 (FIG. 4) or 510 (FIG. 6); a TEC 710, which may be similar to either of the above-described TECs 314 (FIG. 4) or 514 (FIG. 6); and a heat pipe 712, which may be similar to either of the above-described heat pipes 318 (FIG. 4) or 516 (FIG. 6). As the PCD 700 may be similar to any of the above-described PCDs 102 (FIGS. 1-2), 300 (FIGS. 3-4) or 500 (FIGS. 5-6), the control system 702 accordingly may be included in any of those above described PCDs.

As understood by one of ordinary skill in the art, the charger IC 708 is configured to use power supplied from a docking device (not shown in FIG. 7) to charge a PCD battery (not shown). In the illustrated embodiment, the charger IC 708 is a separate device from other integrated circuit devices (not shown) in the PCD 700, such as a system-on-a-chip ("SoC") that may contain various processors. The PCD 700 may also include a thermal coupler 714, which may be similar to any of the above-described thermal coupler 114 (FIG. 1), connector body portion 304 (FIG. 4), or thermal pad 502 (FIG. 6). A first end of the heat pipe 712 may be in contact with the charger IC 708, and a second end of the heat pipe 712 may be in contact with the TEC 710. The TEC 710 may be in contact with the thermal coupler 714.

The control system 702 may be configured to obtain temperature measurements using the thermal sensor 706. The control system 702 may also be configured to determine whether the PCD 500 is coupled (i.e., docked) to a docking device. The control system 702 may determine whether the PCD 700 is connected to a docking device in any manner, such as by detecting signals produced by the docking device through a connector or wirelessly. The control system 702 may further be configured to activate the TEC 710 based on one or more of the temperature measurements when the PCD 700 is connected to the docking device. Note that in the embodiment illustrated in FIG. 7 the TEC 710 and heat pipe 712 operate together provide an active heat transfer system that, when activated, may transfer or move heat from the charger IC 708 to the docking device.

The controller 704 may have an input coupled to an output of the sensor 706 to receive the above-referenced temperature measurements and may have an output coupled to an input of the TEC 710 to provide a control signal to the TEC 710 (e.g., to activate and deactivate the TEC 710). As described below with regard to an exemplary method, the control system 702 may base a determination whether to activate the TEC 710 on at least one of the temperature measurements, such as for example, on a comparison between a temperature measurement and a threshold. As also described below with regard to another exemplary method, the control system 702 may base a determination whether to activate the TEC 710 on at least one of the temperature measurements, such as for example, on a comparison between a temperature measurement and a previous temperature measurement, to determine if a rate of temperature increase exceeds a threshold. The controller 704 may have another output coupled to the charger IC 708 (or similarly to any other heat source component in still other embodiments) to control the charger IC 708 based on the temperature measurements when the PCD 700 is connected to the docking device. Thermal insulation 716 may be included around the charger IC 710 or other heat source component to reduce heat transfer from the charger IC 710 to components of the PCD 700 other than the heat pipe 712.

Figure 8:
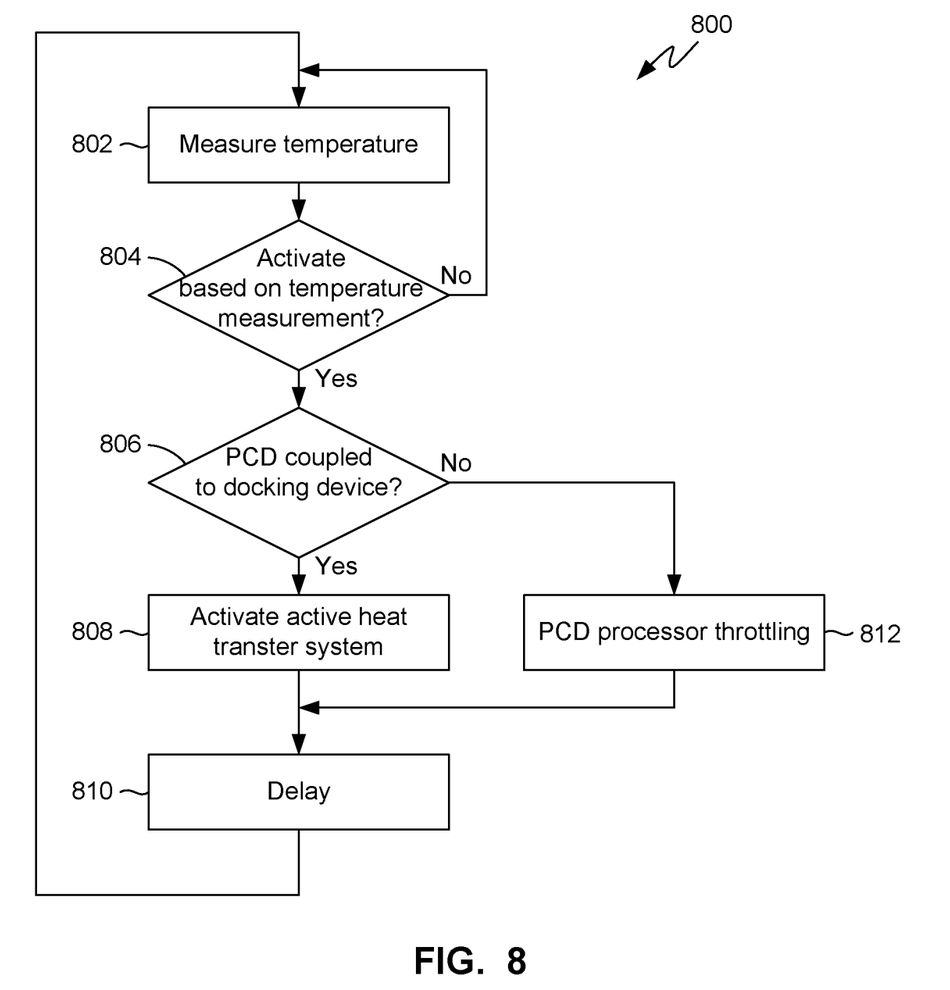
FIG. 8 is a flowchart illustrating a method for thermal mitigation in a PCD, in accordance with exemplary embodiments.

As illustrated in FIG. 8, an exemplary method 800 for thermal mitigation in a PCD may be performed or controlled in any of the above-described PCDs 102 (FIGS. 1-2), 300 (FIGS. 3-4), 500 (FIG. 5-6), or 700 (FIG. 7). For example, the method 800 may be controlled by the controller 704 (FIG. 7). The controller 704 may comprise a processor configured with software or firmware that, when executed, controls the method 800. As indicated by block 802, a temperature may be measured using a thermal sensor. Note that as the method 800 is performed repeatedly (as indicated by the loop returning to block 802 from block 810), a plurality of temperature measurements may be obtained at a periodic time interval. As indicated by block 804, a decision is made whether, based on at least one temperature measurement, whether there is a need for (i.e., a potential benefit from) thermal mitigation. For example, the temperature measurement may be compared with a threshold. If it is determined that the temperature measurement does not exceed the threshold, the method 800 may include repeatedly obtaining (block 802) and comparing (block 804) measurements in this manner until such time as it may be determined that a temperature measurement exceeds a threshold. Alternatively, for example, the temperature measurement may be compared with a previous temperature measurement to determine if the difference between the two temperature measurements indicates that a rate of temperature increase exceeds a threshold. If it is determined that the difference between the temperature measurement and the previous temperature measurement does not exceed the threshold, the method 800 may include repeatedly obtaining (block 802) and comparing (block 804) measurements in this manner until such time as it may be determined that a difference between a temperature measurement and a previous temperature measurement exceeds a threshold.

If it is determined (block 804) based on at least one of the temperature measurements that there is a need for thermal mitigation, then it may be determined whether the PCD is coupled or docked to a docking device, as indicated by block 806. If it is determined that the PCD is docked to a docking device (and it has been determined that there is a need for thermal mitigation), then the active heat transfer system of the PCD may be activated, as indicated by block 808.

If it determined (block 806) that the PCD is not docked to the docking device (and it has been determined that there is a need for thermal mitigation), then PCD processor throttling may be initiated. Such PCD processor throttling may be of a conventional type, such as applying DCVS to a processor, reducing certain PCD functionality, suspending or exiting certain applications, etc. The method 800 may be performed repeatedly, e.g., at time intervals defined by a delay (block 810), so as to provide a type of active thermal mitigation in the PCD while the PCD is being charged or is otherwise docked to a docking station and another type of active thermal mitigation in the PCD while the PCD is not being charged or is otherwise not docked to a docking station.

Figure 9:
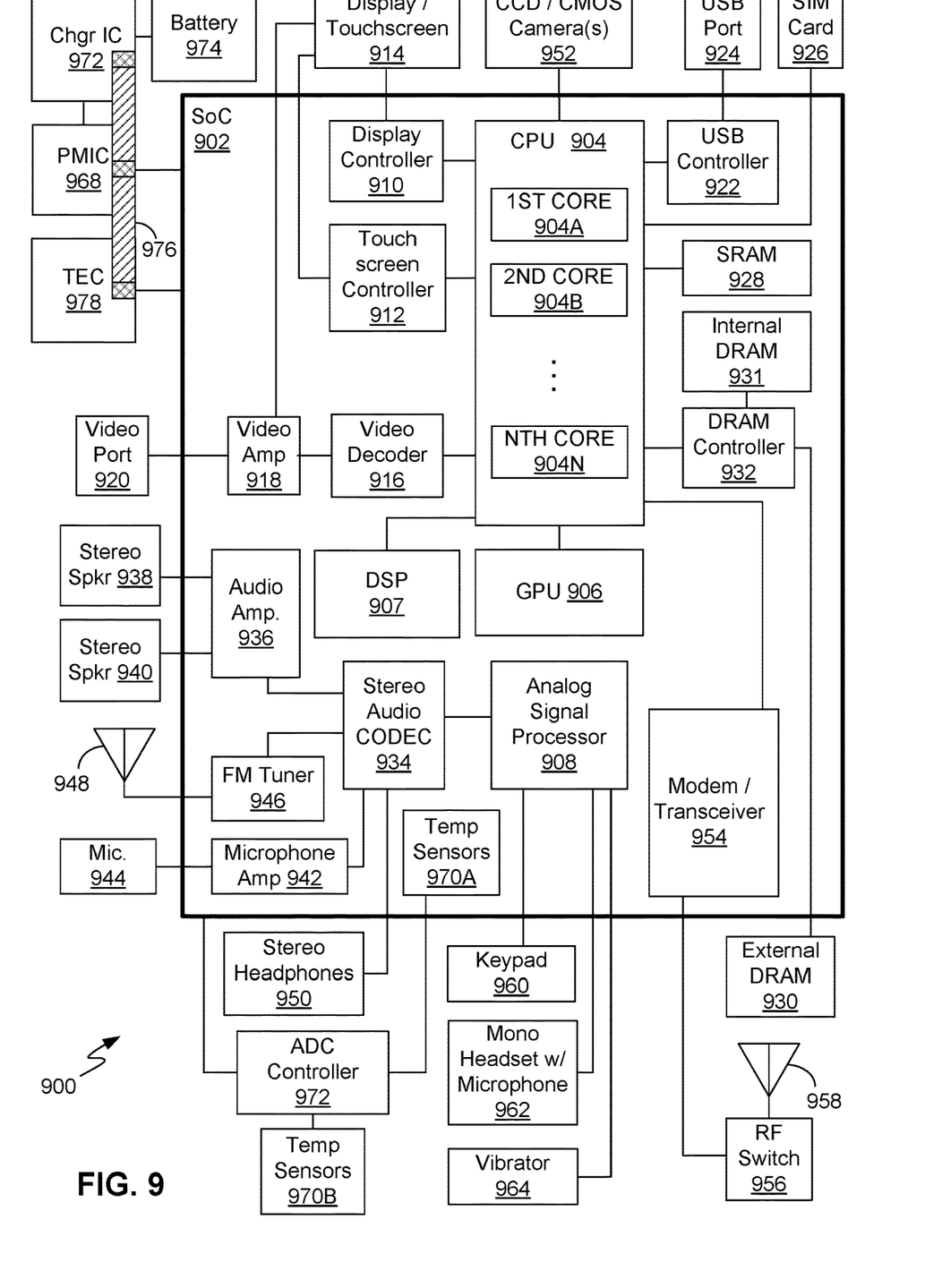
FIG. 9 is a block diagram of a PCD, in accordance with exemplary embodiments.

As illustrated in FIG. 9, exemplary embodiments of systems and methods for configuring a thermal management system using one or more TPEs may be provided in a PCD 900. The PCD 900 may be an example of any of the above-described PCDs 102 (FIGS. 1-2), 300 (FIGS. 3-4), 500 (FIGS. 5-6), or 700 (FIG. 7).

The PCD 900 may include an SoC 902. The SoC 902 may include a CPU 904, a GPU 906, a DSP 907, an analog signal processor 908, or other processors. The CPU 904 may include multiple cores, such as a first core 904A, a second core 904B, etc., through an Nth core 904N. In some embodiments, the above-described controller 704 (FIG. 7) may comprise a functional portion of the CPU 904 or other processor of the PCD 900.

A display controller 910 and a touch-screen controller 912 may be coupled to the CPU 904. A touchscreen display 914 external to the SoC 902 may be coupled to the display controller 910 and the touch-screen controller 912. The PCD 900 may further include a video decoder 916 coupled to the CPU 904. A video amplifier 918 may be coupled to the video decoder 916 and the touchscreen display 914. A video port 920 may be coupled to the video amplifier 918. A universal serial bus ("USB") controller 922 may also be coupled to CPU 904, and a USB port 924 may be coupled to the USB controller 922. A subscriber identity module ("SIM") card 926 may also be coupled to the CPU 904.

One or more memories may be coupled to the CPU 904. The one or more memories may include both volatile and non-volatile memories. Examples of volatile memories include static random access memory ("SRAM") 928 and dynamic RAMs ("DRAM"s) 930 and 931. Such memories may be external to the SoC 902, such as the DRAM 930, or internal to the SoC 902, such as the DRAM 931. A DRAM controller 932 coupled to the CPU 904 may control the writing of data to, and reading of data from, the DRAMs 930 and 931. In other embodiments, such a DRAM controller may be included within a processor, such as the CPU 904.

A stereo audio CODEC 934 may be coupled to the analog signal processor 908. Further, an audio amplifier 936 may be coupled to the stereo audio CODEC 934. First and second stereo speakers 938 and 940, respectively, may be coupled to the audio amplifier 936. In addition, a microphone amplifier 942 may be coupled to the stereo audio CODEC 934, and a microphone 944 may be coupled to the microphone amplifier 942. A frequency modulation ("FM") radio tuner 946 may be coupled to the stereo audio CODEC 934. An FM antenna 948 may be coupled to the FM radio tuner 946. Further, stereo headphones 950 may be coupled to the stereo audio CODEC 934. Other devices that may be coupled to the CPU 904 include one or more digital (e.g., CCD or CMOS) cameras 952.

A modem or RF transceiver 954 may be coupled to the analog signal processor 908. An RF switch 956 may be coupled to the RF transceiver 954 and an RF antenna 958. In addition, a keypad 960, a mono headset with a microphone 962, and a vibrator device 964 may be coupled to the analog signal processor 908.

The SoC 902 may have one or more internal or on-chip thermal sensors 970A and may be coupled to one or more external or off-chip thermal sensors 970B. An analog-to-digital converter ("ADC") controller 972 may convert voltage drops produced by the thermal sensors 970A and 970B to digital signals. A thermal sensor 970A or 970B may be an example of the above-described thermal sensor 706 (FIG. 7).

A charger IC 972 may be coupled to a power management integrated circuit ("PMIC") 968 and to a battery 974. Although not shown for purposes of clarity, the PCD 900 includes a connector or circuitry configured to couple power provided by a docking station to the charger IC 972. A heat pipe 976 may be coupled to the charger IC 972 and the PMIC 968, both of which are examples of heat source components. A first end of the heat pipe 976 may be coupled to the charger IC 972, and a second end of the heat pipe 976 may be coupled to a TEC 978. A portion of the heat pipe 976 between its first and second ends may be coupled to the PMIC 968. The TEC 978 and heat pipe 976 may function in the manner described above with regard to similar TEC and heat pipe elements in other PCD embodiments. As the PCD 900 is shown in block diagram form, mechanical or spatial aspects of the PCD 900 that may relate to heat transfer are not shown. Nevertheless, such aspects may be similar to those described above with regard to other PCD embodiments.

Firmware or software may be stored in any of the above-described memories, such as DRAM 930 or 931, SRAM 928, etc., or may be stored in a local memory directly accessible by the processor hardware on which the software or firmware executes. Execution of such firmware or software may control aspects of any of the above-described methods (e.g., method 800 of FIG. 8) or configure aspects any of the above-described systems. Any such memory having firmware or software stored therein in computer-readable form for execution by processor hardware may be an example of a "computer program product," "computer-readable medium," etc., as such terms are understood in the patent lexicon.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A system for thermal mitigation in a portable computing device ("PCD"), comprising:
   a PCD case containing one or more PCD processor systems;
   a thermal coupler having a portion exposed externally to the PCD case; and
   an active heat transfer system within the PCD case, the active heat transfer system having a first portion thermally coupled to a heat source component within the PCD case and a second portion thermally coupled to the thermal coupler, the active heat transfer system comprises a thermoelectric device positioned entirely within the PCD case and a control system also positioned entirely within the PCD case, the active heat transfer system configured to transfer thermal energy from the first portion to the second portion when activated by the control system and is activated by the control system based on a temperature measurement of the heat source component and when the control system detects that the PCD is coupled to a docking device, the docking device supplying power that the thermoelectric device consumes during operation when the active heat transfer system is activated by the control system.

2. The system of claim 1, wherein the portion of the thermal coupler exposed externally to the PCD case comprises a connector body portion of an electrical signal connector configured to communicate electrical signals between the PCD and the docking device.

3. The system of claim 1, wherein the portion of the thermal coupler exposed externally to the PCD case comprises a thermally conductive pad on a face of the PCD case.

4. The system of claim 1, wherein the thermoelectric device is directly connected to the thermal coupler.

5. The system of claim 1, wherein:
   the portion of the thermal coupler exposed externally to the PCD case comprises a connector body portion of an electrical signal connector configured to communicate electrical signals between the PCD and the docking device; and
   the thermoelectric device is configured to receive power through the electrical signal connector from the docking device.

6. The system of claim 1, wherein:
   the portion of the thermal coupler exposed external to the PCD case comprises a thermally conductive pad on a face of the PCD case; and
   the thermoelectric device is configured to receive power from the docking device when the thermally conductive pad is in contact with the docking device.

7. The system of claim 1, wherein the active heat transfer system comprises a heat pipe.

8. The system of claim 1, wherein the heat source component comprises at least one of a battery charger integrated circuit, a processor, a radio frequency (RF) chip, or a battery.

9. The system of claim 1, wherein the active heat transfer system comprises:
   a thermal sensor within the PCD case; and
   the control system within the PCD case is configured to:
      obtain a plurality of temperature measurements using the thermal sensor;
      determine whether it is beneficial to activate the active heat transfer system based on at least one of the temperature measurements; and
      activate the active heat transfer system in response to a determination that it is beneficial to activate the active heat transfer system and a determination that the PCD is coupled to the docking device.

10. The system of claim 9, wherein the control system is configured to determine whether it is beneficial to activate the active heat transfer system by being configured to determine whether at least one of the temperature measurements exceeds a threshold.

11. The system of claim 9, wherein the control system is configured to determine whether it is beneficial to activate the active heat transfer system by being configured to determine whether a rate of temperature increase exceeds a threshold.

12. A system for thermal mitigation in a portable computing device ("PCD"), comprising:
   a PCD case containing one or more PCD processor systems;
   a thermal coupler having a portion exposed external to the PCD case;
   a thermoelectric device thermally coupled to the thermal coupler, the thermoelectric device positioned entirely within the PCD case;
   a control system positioned entirely within the PCD and controlling the thermoelectric device; and
   a heat pipe having a first end thermally coupled to a heat source component within the PCD case and a second end thermally coupled to the thermoelectric device, the heat pipe configured to transfer thermal energy from the first end to the second end, the thermoelectric device configured to transfer thermal energy from the second end of the heat pipe to the thermal coupler when activated by the control system, wherein the thermoelectric device is activated by the control system based on a temperature measurement of the heat source component and when the control system detects the PCD is coupled to a docking device, the docking device supplying power that the thermoelectric device consumes during operation when the thermoelectric device is activated by the control system.

13. The system of claim 12, wherein the heat source component comprises at least one of a battery charger integrated circuit, a processor, a radio frequency (RF) chip, or a battery.

14. The system of claim 12, wherein the portion of the thermal coupler exposed externally to the PCD case comprises a connector body portion of an electrical signal connector configured to communicate electrical signals between the PCD and the docking device.

15. The system of claim 14, wherein the thermoelectric device is configured to receive power through the electrical signal connector from the docking device.

16. The system of claim 12, wherein the portion of the thermal coupler exposed externally to the PCD case comprises a thermally conductive pad on a face of the PCD case.

17. The system of claim 16, wherein the thermoelectric device is configured to receive power from the docking device when the thermally conductive pad is in contact with the docking device.

18. The system of claim 12, further comprising:
a thermal sensor within the PCD case; and
the control system within the PCD case is configured to:
obtain a plurality of temperature measurements using the thermal sensor;
determine whether it is beneficial to activate the thermoelectric device based on at least one of the temperature measurements;
and
activate the thermoelectric device in response to a determination that it is beneficial to activate the thermoelectric device and a determination that the PCD is coupled to the docking device.

19. The system of claim 18, wherein the control system is configured to determine whether it is beneficial to activate the thermoelectric device by being configured to determine whether at least one of the temperature measurements exceeds a threshold.

20. The system of claim 18, wherein the control system is configured to determine whether it is beneficial to activate the thermoelectric device by being configured to determine whether a rate of temperature increase exceeds a threshold.

21. A method for thermal mitigation in a portable computing device ("PCD"), comprising:
a control system within a PCD case obtaining a plurality of temperature measurements associated with a heat source component of the PCD over a time interval using a thermal sensor within the PCD case;
the control system within the PCD case determining whether the PCD is coupled to a docking device; and
the control system within the PCD case activating an active heat transfer system within the PCD case based on at least one of the plurality of temperature measurements when the PCD is coupled to the docking device, wherein the control system within the PCD case activating the active heat transfer system comprises transferring thermal energy from a first portion of the active heat transfer system thermally coupled to a heat source component within the PCD to a second portion of the active heat transfer system thermally coupled to a portion of a thermal coupler exposed externally to the PCD case, the active heat transfer system comprises a thermoelectric device positioned entirely within the PCD case under control of the control system and which transfers the thermal energy from the first portion to the second portion, the docking device supplying power that the thermoelectric device consumes during operation when the active heat transfer system is activated by the control system.

22. The method of claim 21, wherein transferring thermal energy from the first portion of the active heat transfer system to the portion of the thermal coupler exposed externally to the PCD case comprises conducting the thermal energy to a portion of an electrical signal connector configured to communicate electrical signals between the PCD and the docking device.

23. The method of claim 21, wherein transferring thermal energy from the first portion of the active heat transfer system to the portion of the thermal coupler exposed externally to the PCD case comprises conducting the thermal energy to a thermally conductive pad on a face of the PCD case.

24. The method of claim 21, further comprising conducting the thermal energy from the thermoelectric device directly to the thermal coupler.

25. The method of claim 24, wherein:
conducting the thermal energy from the thermoelectric device directly to the thermal coupler comprises conducting the thermal energy to a connector body portion of an electrical signal connector configured to communicate electrical signals between the PCD and the docking device; and
powering the thermoelectric device through the electrical signal connector from the docking device.

26. The method of claim 24, wherein:
conducting the thermal energy from the thermoelectric device directly to the thermal coupler comprises conducting the thermal energy to a thermally conductive pad on a face of the PCD; and
powering the thermoelectric device from the docking device when the thermally conductive pad is in contact with the docking device.

27. The method of claim 21, wherein transferring thermal energy from the first portion of the active heat transfer system to the second portion of the active heat transfer system comprises transferring thermal energy through a heat pipe.

28. The method of claim 21, further comprising conducting the thermal energy from a battery charger circuitry in the PCD case to the first portion of the active heat transfer system.

* * * * *